(12) United States Patent
Hasegawa

(10) Patent No.: US 7,279,990 B2
(45) Date of Patent: Oct. 9, 2007

(54) SIGMA-DELTA MODULATOR FOR PLL CIRCUITS

(75) Inventor: Morihito Hasegawa, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 45 days.

(21) Appl. No.: 11/363,049

(22) Filed: Feb. 28, 2006

(65) Prior Publication Data

US 2006/0139194 A1    Jun. 29, 2006

Related U.S. Application Data

(63) Continuation of application No. PCT/JP2003/015215, filed on Nov. 28, 2003.

(51) Int. Cl.
*H03L 7/18* (2006.01)
*H03M 3/02* (2006.01)

(52) U.S. Cl. .......................... 331/16; 331/1 A; 341/143

(58) Field of Classification Search ................ 331/1 A, 331/16, 25; 341/126, 143
See application file for complete search history.

(56) References Cited

U.S. PATENT DOCUMENTS 5,093,632 A    3/1992   Hietala et al.

2005/0153662 A1*   7/2005   Hasegawa .................... 455/76

FOREIGN PATENT DOCUMENTS

JP         2003-023351 A      1/2003
WO         03/028218 A1       4/2003

* cited by examiner

*Primary Examiner*—David Mis
(74) *Attorney, Agent, or Firm*—Arent Fox LLP

(57) ABSTRACT

A sigma-delta modulator for generating a modulation signal that modulates a frequency division ratio of a comparator/frequency divider of a PLL circuit. Series-connected integrators accumulate an input signal and output overflow signals when their accumulated values exceed a predetermined value. Differentiators transfer the overflow signals of the integrators. An adder multiplies output signals output from the differentiators by a predetermined coefficient and adds the products. A control circuit for transferring the accumulated value in synchronization with a clock signal of each integrator is connected between the integrator of a final stage and the integrator of the preceding stage. The control circuit reduces the modulation width of the modulation signal without reducing the order number of the modulator.

11 Claims, 13 Drawing Sheets

A

SIGMA-DELTA MODULATOR FOR PLL CIRCUITS

CROSS-REFERENCE TO RELATED APPLICATIONS

This application is a continuation of international patent application No. PCT/JP2003/015215, filed Nov. 28, 2003, the entire contents being incorporated herein by reference.

BACKGROUND OF THE INVENTION

The present invention relates to a PLL circuit, and more particularly, to a PLL circuit using a sigma-delta modulator.

In recent years, PLL circuits for use in mobile communication devices, such as cellular phones, are required not only to be further highly integrated and consume less power but must also improve their channel switching speed and C/N (carrier-to-noise ratio) characteristic. To satisfy these requirements, PLL circuits using sigma-delta modulators have been commercialized. The PLL circuits using sigma-delta modulators are required to further improve their channel switching speed and C/N characteristic.

The channel switching time and the C/N characteristic are loop characteristics that are important in PLL circuits. More specifically, a PLL circuit is required to shorten the time taken to switch from one lockup frequency to another lockup frequency, while reducing phase noise contained in the frequency of an output signal.

To satisfy these requirements, a fractional-N PLL frequency synthesizer (PLL circuits) has been commercialized in recent years. The fractional-N PLL frequency synthesizer uses a fractional frequency division ratio of a comparator/frequency divider that forms a PLL loop. Such a fractional frequency division type PLL circuit increases the frequency of a reference signal and is thus advantageous in improving the channel switching time and the C/N characteristic.

However, the fractional value for the fractional frequency division ratio is obtained in an equivalent and averaged manner by changing the integral frequency division value over time. More specifically, the fractional frequency division ratio is obtained in an equivalent manner by cyclically performing frequency division by N+1 while constantly performing frequency division by a fixed frequency division value N. For example, for a frequency division of 1/8, the eight frequency division operations are performed by repeating N frequency division seven times and N+1 frequency division once. In the frequency division of 3/8, eight frequency division operations are performed by repeating N frequency division five times and N+1 frequency division three times.

However, when using a phase comparator to compare the comparison signal obtained from the fractional frequency division operation with a reference signal, the N frequency division and N+1 frequency division are cyclically repeated. This results in a cyclic phase error. As a result, spurious noise is generated in the output signal of a voltage controlled oscillator.

As one method for preventing generation of such spurious noise resulting from fractional frequency division, a sigma-delta fractional-N PLL frequency synthesizer 100 including a multi-stage noise shaping (MASH) sigma-delta modulator, as shown in FIG. 13, has been proposed. The sigma-delta modulator provides one method for randomly changing the frequency division value that is used in fractional frequency division to prevent generation of spurious noise.

In FIG. 13, an oscillator 1 outputs a reference clock signal, which has an inherent frequency based on the oscillation of a crystal oscillator, to a reference frequency divider 2. The reference frequency divider 2, which is formed by a counter circuit, outputs a reference signal fr, which is generated by dividing the frequency of the reference clock signal based on a preset frequency division ratio, to a phase comparator 3.

A comparison signal fp is input into the phase comparator 3 from a comparator/frequency divider 4. The phase comparator 3 outputs a pulse signal, which is in accordance with the phase difference between the reference signal fr and the comparison signal fp, to a charge pump 5.

The charge pump 5 outputs an output signal to a lowpass filter (LPF) 6 based on the pulse signal output from the phase comparator 3.

This output signal is formed by a direct current element containing a pulse element. The direct current element changes as the frequency of the pulse signal changes. The pulse element changes based on the phase difference of the pulse signal.

The LPF 6 outputs, as a control voltage, an output signal, which is obtained by smoothing the output signal of the charge pump 5 and removing high frequency elements from the smoothed signal, to a voltage controlled oscillator (VCO) 7.

The VCO 7 outputs an output signal fvco, which has frequency that is in accordance with the control voltage, to an external circuit and the comparator/frequency divider 4.

The frequency division ratio of the comparator/frequency divider 4 is set in a manner that the ratio is freely changed by a sigma-delta modulator 8.

The sigma-delta modulator 8 is formed as a third-order modulator including integrators (Σ) 9a to 9c having n bits, differentiators (Δ) 10a to 10f formed by flip-flop circuits, and an adder 11. The integrators 9a to 9c and the differentiators 10a to 10f operate using the comparison signal fp input from the comparator/frequency divider 4 as a clock signal.

A numerator value F of the sigma-delta modulator 8 is input into the integrator 9a from an external device (not shown). The integrator 9a accumulates the input value F based on a clock signal. When the accumulated value exceeds a denominator value (modulo value) Q, the integrator 9a outputs an overflow signal OF1. After the overflow, the integrator 9a divides the accumulated value by the denominator value Q, and continues accumulating the input value F.

The denominator value (modulo value) Q is set at $2^n$. The numerator value F is input as a digital signal having n−1 bits with respect to the power n of the denominator value Q. The denominator value Q, which is the same value for the integrators 9a to 9c, is, for example, 1024, and the numerator value F is 30.

The overflow signal OF1 of the integrator 9a is provided as an input signal a to the adder 11 via the differentiators 10a and 10b. An accumulated value X1 of the integrator 9a is provided to the integrator 9b.

The integrator 9b, which performs an accumulating operation of an input signal having the accumulated value X1, outputs an accumulated value X2 resulting from the accumulation to the integrator 9c. Further, an overflow signal OF2 output from the integrator 9b is provided as an input signal b to the adder 11 via the integrator 10c and as an input signal c to the adder 11 via the differentiators 10c and 10d.

The integrator 9c, which performs an accumulating operation of an input signal having the accumulated value X2, outputs an overflow signal OF3. The overflow signal OF3 is provided as an input signal d to the adder 11, provided as an input signal e to the adder 11 via the integrator 10e, and provided as an input signal f to the adder 11 via the differentiators 10e and 10f.

The differentiators 10a, 10b, and 10d are included to correct errors in the timings of the input signals a to f that may be caused by the operations of the differentiators 10c, 10e, and 10f in accordance with the clock signal.

Based on the input signals a to f, the adder 11 performs the computation:

(+1)a+(+1)b+(−1)c+(+1)d+(−2)e+(+1)f.

The coefficients by which the input signals a to f are multiplied are set based on Pascal's triangle.

FIG. 7 shows the computation result (excluding +N) of the computation operation performed by the adder 11 described above. As shown in the drawing, the adder 11 generates random numbers that change arbitrarily in a range of +4 to −2.

A fixed frequency division ratio N that is set in advance is input into the adder 11. The adder 11 adds the above computation result to the fixed frequency division ratio N and outputs the result to the comparator/frequency divider 4.

With this operation performed by the adder 11, the frequency division ratio input into the comparator/frequency divider 4 changes randomly with respect to the fixed frequency division ratio N in a manner such as N, N+1, N, N−2, N+3, N−1, . . . , N+4, to N−1.

In the comparator/frequency divider 4, a fractional frequency division operation is performed averagely based on the frequency division ratio output from the adder 11.

FIG. 7 shows examples of the random numbers that are the computation values output from the adder 11 of the third-order sigma-delta modulator 8 shown in FIG. 13. FIG. 10 shows examples of random numbers generated in a second-order sigma-delta modulator. As shown in the two drawings, the fluctuation width of the output signal of the sigma-delta modulator increases and the modulation width of the frequency division ratio of the comparator/frequency divider 4 increases as the order number of the sigma-delta modulator increases.

FIG. 15 shows the frequency spectrum of the output signal of the fractional-N PLL frequency synthesizer 100 using the third-order sigma-delta modulator described above. FIG. 14 shows the frequency spectrum of the output signal of a fractional-N PLL frequency synthesizer using a second-order sigma-delta modulator, and FIG. 16 shows the same frequency spectrum in the case of a fourth-order sigma-delta modulator.

As apparent when comparing FIGS. 14 to 16, the noise level in the lockup operation of the PLL increases and the C/N characteristic is deteriorated as the order number of the sigma-delta modulator becomes higher.

The C/N characteristic is improved as the order number of the sigma-delta modulator becomes lower. However, the sigma-delta modulation is unstable in this case. Such unstable sigma-delta modulation adversely affects the output signal of the sigma-delta modulator.

SUMMARY OF THE INVENTION

The present invention provides a sigma-delta modulator that decreases the modulation width of a comparator/frequency divider without reducing the order number of the modulator.

One aspect of the present invention is a sigma-delta modulator for generating a modulation signal for modulating a frequency division ratio for a comparator/frequency divider of a PLL circuit. The sigma-delta modulator includes a plurality of series-connected integrators, each accumulating an input signal based on a clock signal and outputting an overflow signal when an accumulated value exceeds a predetermined value. A plurality of differentiators are selectively connected to the plurality of integrators. Each of the differentiators transfers an overflow signal of a corresponding one of the integrators. An adder multiplies the overflow signals transferred from the plurality of differentiators by a predetermined coefficient and adds the products to generate the modulation signal. A control circuit, connected between a first integrator of a final stage and a second integrator of a stage preceding the final stage, provides an output signal of the second integrator to the first integrator in synchronization with a frequency-divided signal obtained by frequency-dividing the clock signal.

DETAILED DESCRIPTION OF THE PREFERRED EMBODIMENTS

Figure 1:
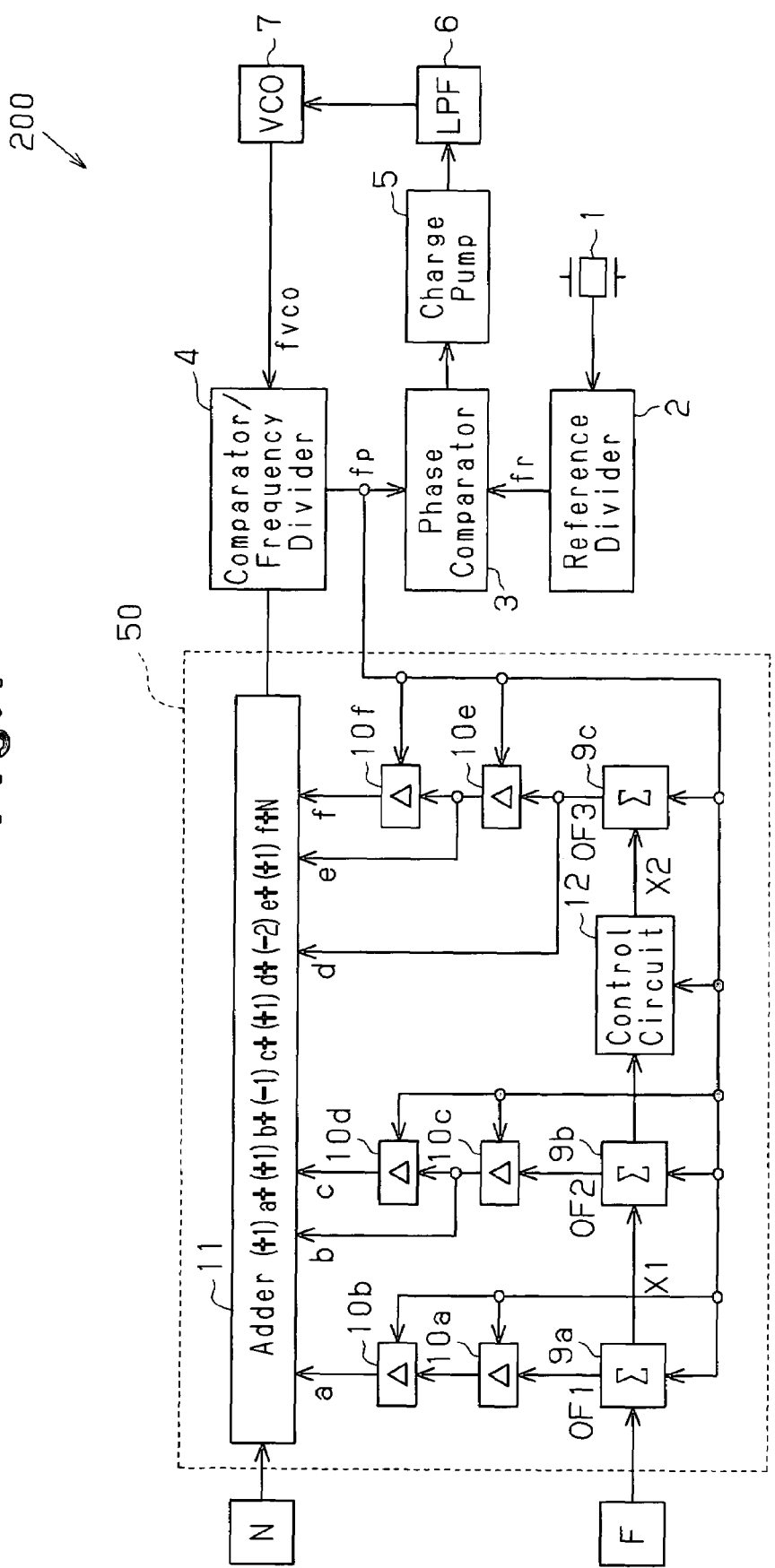
FIG. 1 is a schematic block diagram of a PLL based frequency synthesizer having a third-order sigma-delta modulator according to a preferred embodiment of the present invention.

FIG. 1 shows a sigma-delta fractional-N PLL frequency synthesizer 200 according to a preferred embodiment of the present invention. The frequency synthesizer 200 of the preferred embodiment is formed by adding a control circuit 12 to the sigma-delta modulator 8 of the prior art example shown in FIG. 13. The other structure of the frequency synthesizer 200 is the same as in the prior art example described above.

The frequency synthesizer 200 includes an oscillator 1, a reference frequency divider 2, a phase comparator 3, a comparator/frequency divider 4, a charge pump 5, an LPF (lowpass filter) 6, a voltage controlled oscillator (VCO) 7, and a third-order sigma-delta modulator 50.

The third-order sigma-delta modulator 50 includes three integrators 9a to 9c, six differentiators 10a to 10f, an adder 11, and the control circuit 12. The integrators 9a to 9c and the differentiators 10a to 10f operate in the same manner as in the prior art example shown in FIG. 13. Further, input signals a to f are input into the adder 11.

Based on the input signals a to f, the adder 11 performs the computation:

$$(+1)a+(+1)b+(-1)c+(+1)d+(-2)e+(+1)f.$$

The coefficients by which the input signals a to f are multiplied are set based on Pascal's triangle in the same manner as in the prior art example.

The adder 11 is designed by a well-known automatic logical synthesizer that automatically performs logical synthesis based on, for example, the input of the computation expression described above.

The adder 11 adds a fixed frequency division ratio N, which is input from an external device (not shown), to the above computation result and outputs the computed value to the comparator/frequency divider 4. More specifically, the adder 11 outputs random numbers that arbitrarily change in a range of N+4 to N−2.

The control circuit 12, which is arranged between the integrators 9b and 9c, operates using a comparison signal fp input from the comparator/frequency divider 4 as a clock signal. The control circuit 12 divides the frequency of the clock signal at a frequency division ratio that is set in advance and outputs an accumulated value X2 output from the integrator 9b to the integrator 9c based on the resulting frequency-divided signal.

Figure 2:
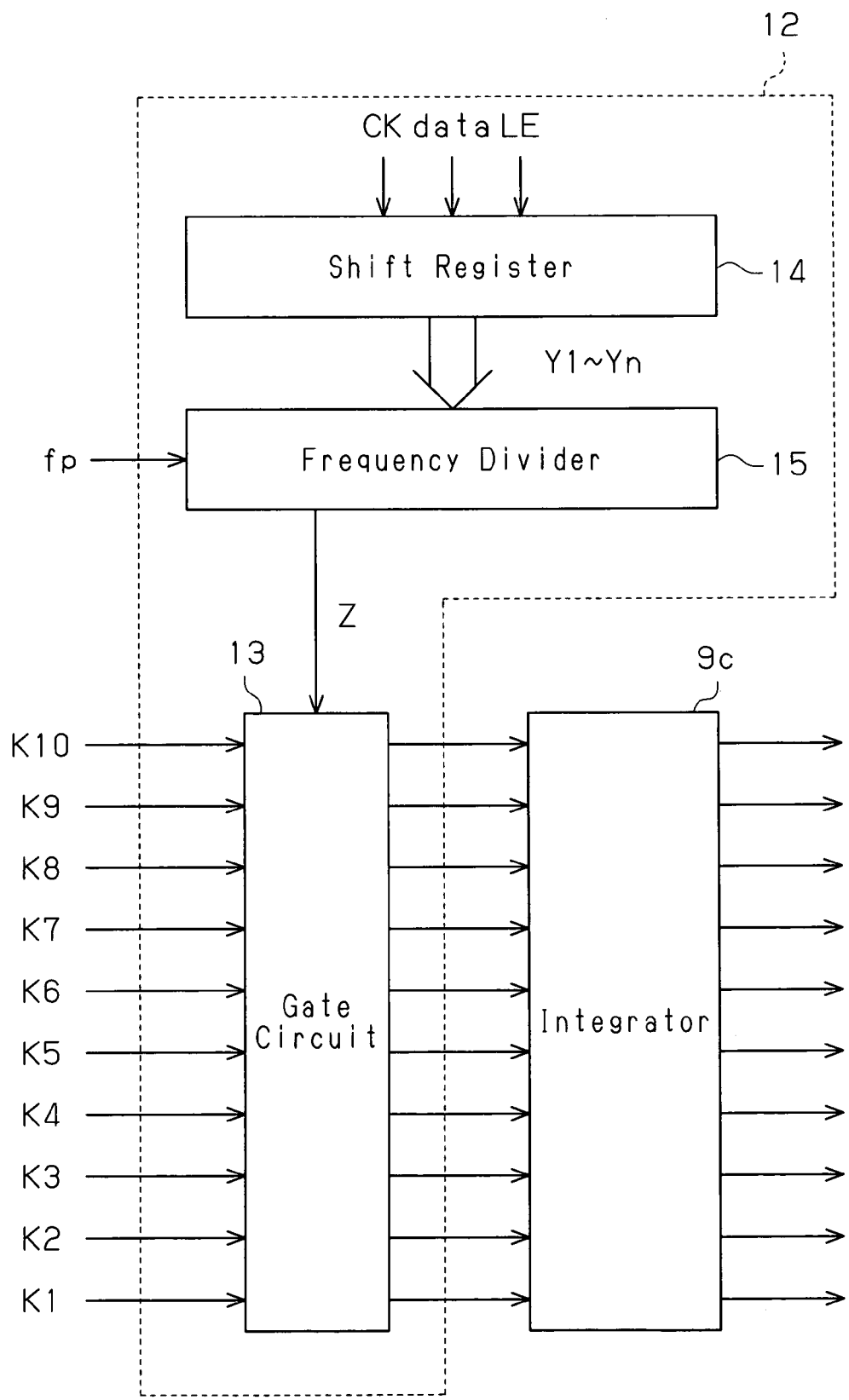
FIG. 2 is a block diagram of a control circuit of the third-order sigma-delta modulator shown in FIG. 1.

Next, the specific structure of the control circuit 12 will be described. As shown in FIG. 2, the control circuit 12 includes a gate circuit 13, a shift register 14, and a frequency divider 15, which are arranged between the integrators 9b and 9c.

The shift register 14 generates frequency division ratio setting signals Y1 to Yn having a plurality of bits based on a clock signal CK, data DATA, and an enable signal LE, which are input from an external device, and outputs the frequency division ratio setting signals Y1 to Yn to the frequency divider 15.

The frequency divider 15 divides the frequency of the comparison signal fp input from the comparator/frequency divider 4, based on the frequency division ratio setting signals Y1 to Yn, and outputs the resulting frequency-divided signal Z to the gate circuit 13.

The specific structure of the frequency divider 15 will now be described with reference to FIG. 4. The frequency divider 15 includes multiple stages of flip-flop circuits 16a to 16d, which are connected in series, and a logic circuit unit 17 for generating the frequency-divided signal Z based on output signals FFL1 to FFL4 of the flip-flop circuits 16a to 16d. The flip-flop circuits 16a to 16d form a normal binary counter.

The comparison signal fp is input into the flip-flop circuit 16a of the first stage. Output signals FF1 to FF3 of the flip-flop circuits 16a to 16c of the preceding stages are input into the flip-flop circuits 16b to 16d of the following stages, respectively.

Figure 5:
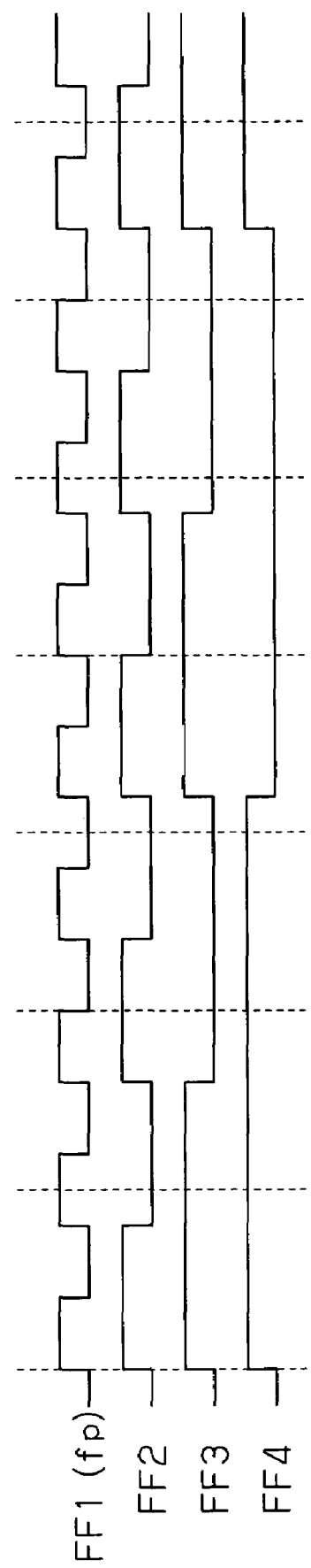
FIG. 5 is an explanatory diagram showing an output signal of a flip-flop circuit shown in FIG. 4.

As shown in FIG. 5, the flip-flop circuit 16a outputs the output signal FF1 that is obtained by dividing the frequency of the comparison signal fp by one, the flip-flop circuit 16b outputs the output signal FF2 that is obtained by dividing the frequency of the output signal FF1 of the flip-flop circuit 16a by two, the flip-flop circuit 16c outputs the output signal FF3 that is obtained by dividing the frequency of the output signal FF2 of the flip-flop circuit 16b by two, and the flip-flop circuit 16d outputs an output signal FF4 that is obtained by dividing the frequency of the output signal FF3 of the flip-flop circuit 16c by two.

As a result, the flip-flop circuit 16c outputs the output signal FF3 that is obtained by dividing the comparison signal fp by four, and the flip-flop circuit 16d outputs the output signal FF4 that is obtained by dividing the comparison signal fp by eight.

The frequency division ratio setting signals Y1 to Y4 are input into the flip-flop circuits 16a to 16d, respectively. When the frequency ratio setting signals Y1 to Y4 have high (H) levels, the output signals FFL1 to FFL4 are output to the logic circuit unit 17. The output signals FF1 to FF4 have the same phases as the output signals FFL1 to FFL4.

For example, when only the frequency division ratio setting signals Y1 to Y2 have H levels, only the output signals FFL1 and FFL2 are output to the logic circuit unit 17. Further, the frequency division ratio setting signals Y1 to Y4 enable any combinations of the output signals FFL1 to FFL4 to be output to the logic circuit unit 17.

The logic circuit unit 17 generates the frequency-divided signal Z that is obtained by dividing the frequency of the comparison signal fp by N based on the output signals FFL1 to FFL4 of the flip-flop circuits 16a to 16d.

Figure 6:
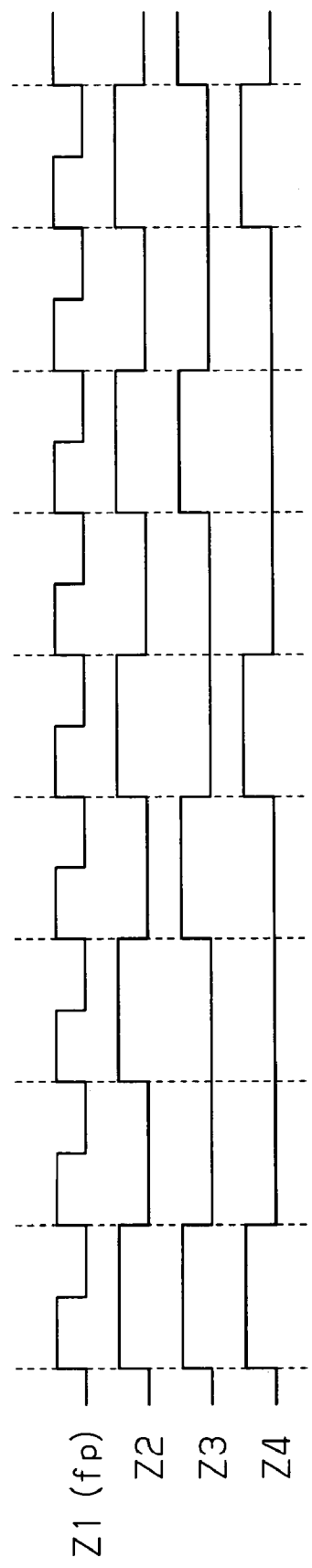
FIG. 6 is an explanatory diagram showing a frequency-divided signal output from a frequency divider.

For example, when the output signal FFL1 is output to the logic circuit unit 17 only from the flip-flop circuit 16a, a frequency-divided signal Z1 output from the logic circuit unit 17 is a signal obtained by dividing the frequency of the comparison signal fp by one, that is, a signal having the same phase as the comparison signal fp as shown in FIG. 6. When the output signals FFL1 and FFL2 are output to the logic circuit unit 17 only from the flip-flop circuits 16a and 16b, a frequency-divided signal Z3 is a signal obtained by dividing the frequency of the comparison signal fp by three.

Figure 4:
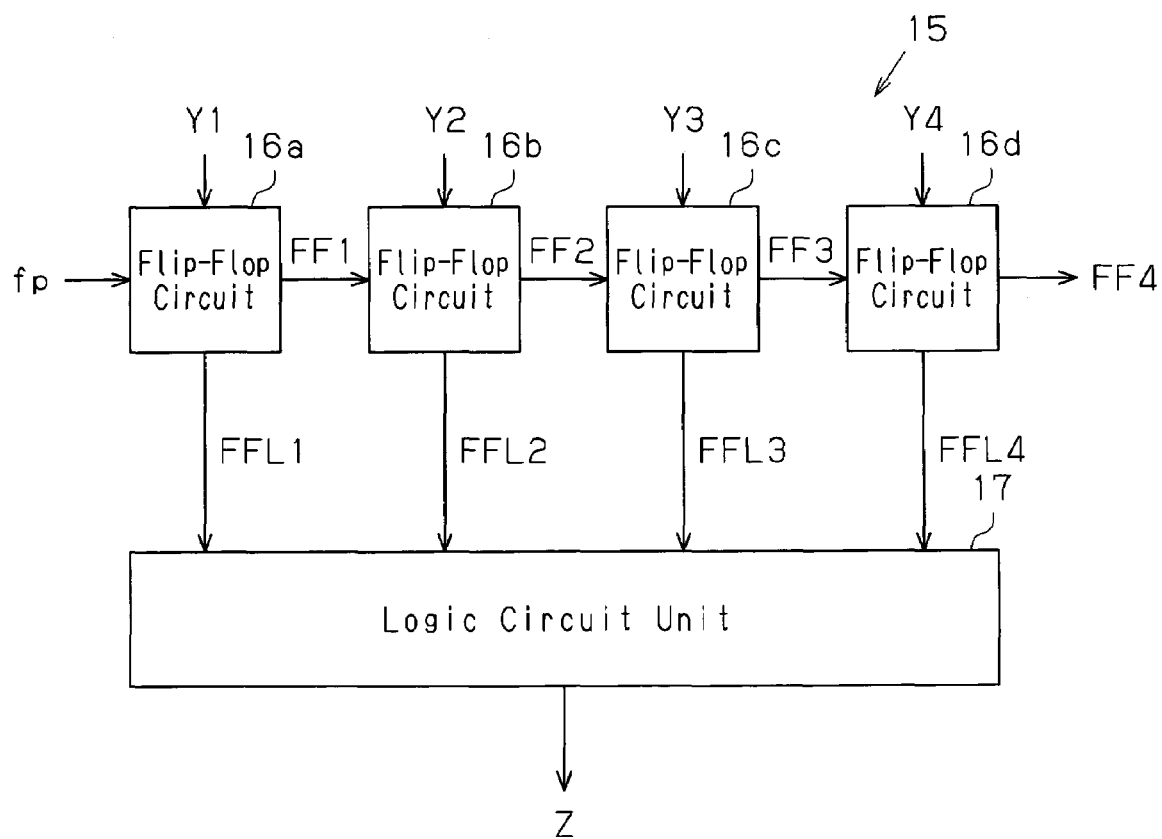
FIG. 4 is a schematic block diagram of a frequency divider shown in FIG. 2.

This structure enables the frequency division ratio of the frequency-divided signal Z output from the frequency divider 15 having the structure shown in FIG. 4 to be set freely in a range of 1 to 15 by appropriately setting the frequency division ratio setting signals Y1 to Y4. Further, an increase in the number of stages of the flip-flop circuits enables the frequency division ratio to be set in a more versatile range.

The accumulated value X2 output from the integrator 9b and the frequency-divided signal Z are input into the gate circuit 13. The accumulated value X2 may be signals K1 to K10 having, for example, ten bits.

Figure 3:
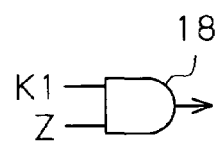
FIG. 3 is a diagram showing a specific structure for a gate circuit shown in FIG. 2.

In the gate circuit 13, the signals K1 to K10 and the frequency-divided signal Z are input into AND circuits 18 as shown in FIG. 3. Thus, the accumulated value X2 is output to the differentiator 9c via the gate circuit 13 only when the frequency-divided signal Z has an H level.

Next, the operation of the sigma-delta modulator 50 having the above-described structure will be described. The frequency division ratio setting signals Y1 to Y4 output from the shift register 14 cause the output signals FFL1 and FFL2 to be output to the logic circuit unit 17 only from the flip-flop circuits 16a and 16b of the frequency divider 15. As a result, the frequency divider 15 outputs the frequency-divided signal Z3, which is obtained by dividing the frequency of the comparison signal fp by three, to the gate circuit 13.

Then, the gate circuit 13 outputs the accumulated value X2 output from the integrator 9b to the integrator 9c at a rate of once every three cycles of the comparison signal fp. Otherwise, the gate circuit 13 outputs all zeros. As a result, the accumulating operation is performed in the integrator 9c only once every three cycles of the comparison signal fp. This reduces the number of times the overflow signal OF3 is output from the integrator 9c.

Figure 8:
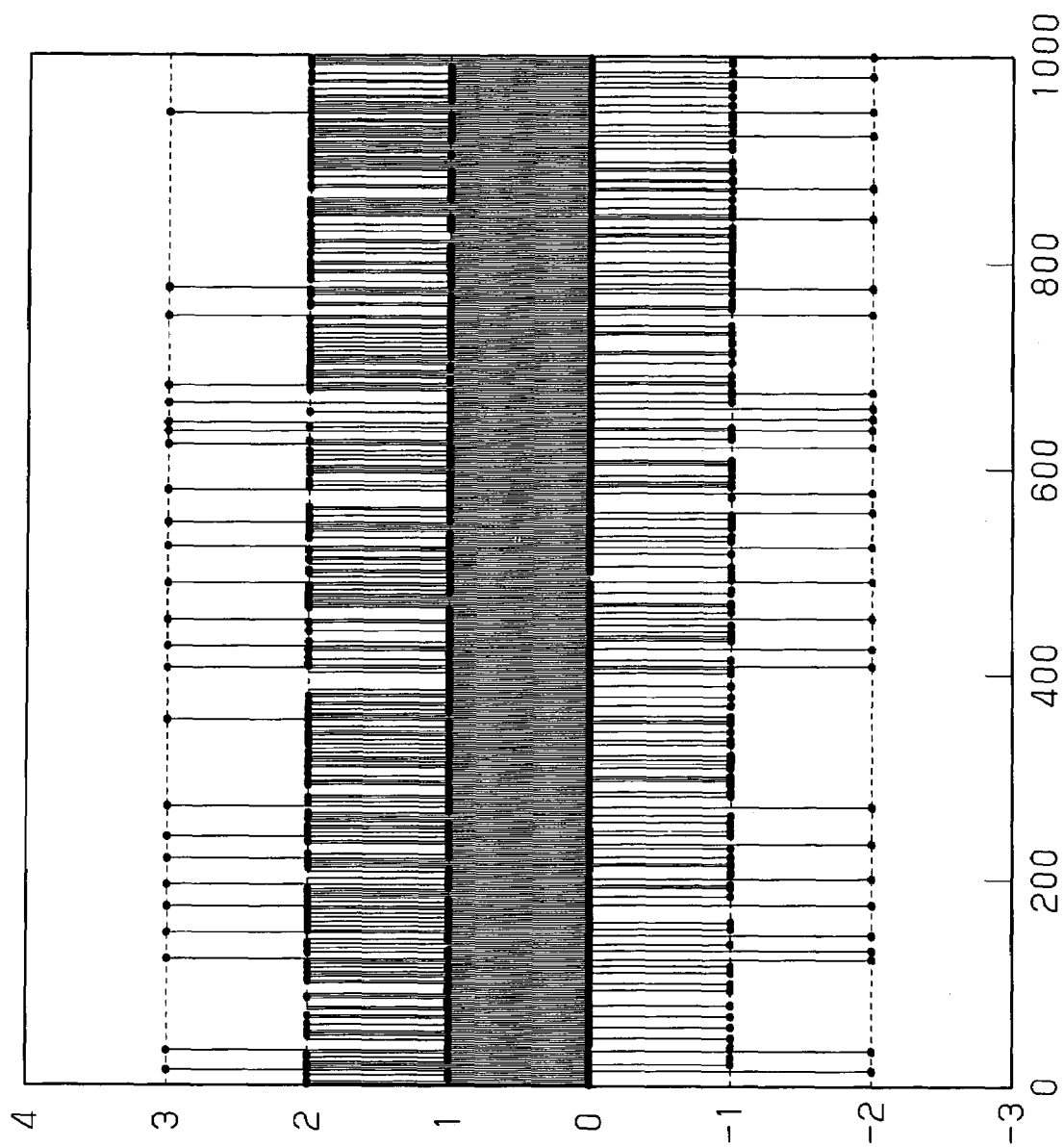
FIG. 8 is an explanatory diagram exemplifying the modulation width of a modulation output of the third-order sigma-delta modulator of the present invention.
Figure 13:
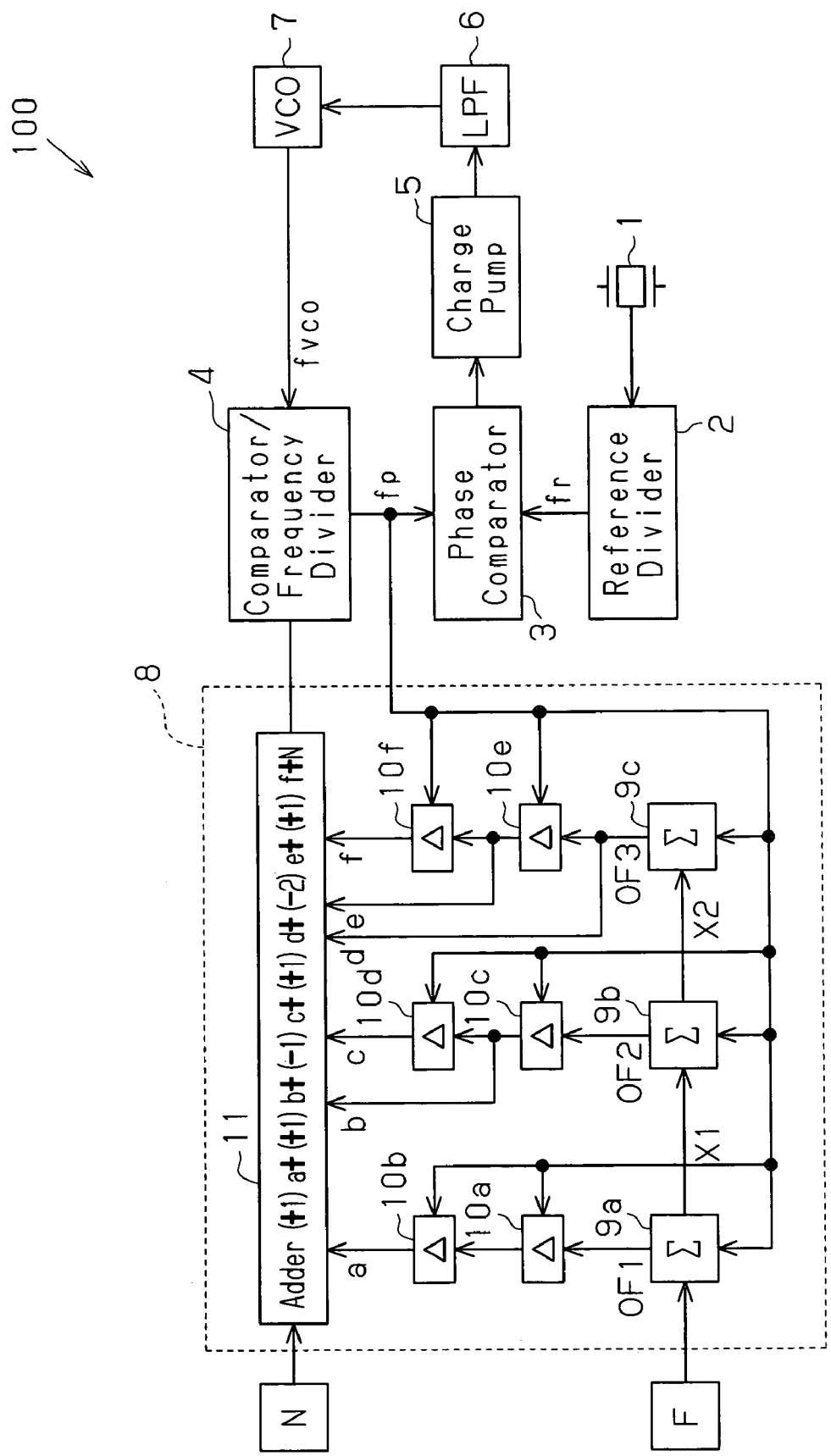
FIG. 13 is a schematic block diagram of a PLL based frequency synthesizer having the third-order sigma-delta modulator in the prior art.
Figure 14:
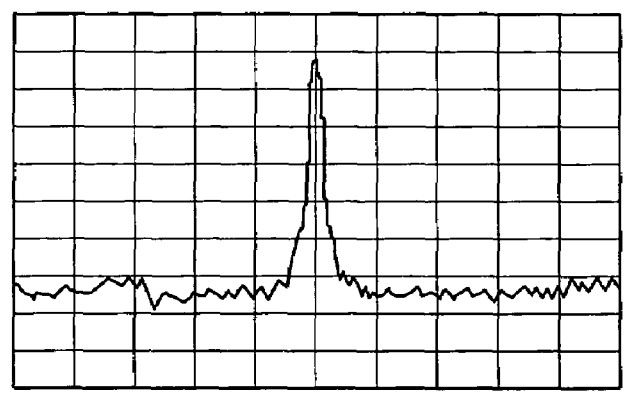
FIG. 14 is an explanatory diagram showing the frequency spectrum of an output signal of a PLL based frequency synthesizer having a second-order sigma-delta modulator.

Due to such an operation, in comparison with the random numbers generated in the normal third-order sigma-delta modulator shown in FIG. 13, as shown in FIG. 8, random numbers generated by the adder 11 do not become +4 and this reduces the fluctuation width of the random numbers. Further, random numbers generated by the adder 11 become +3 or −2 less frequently.

Figure 9:
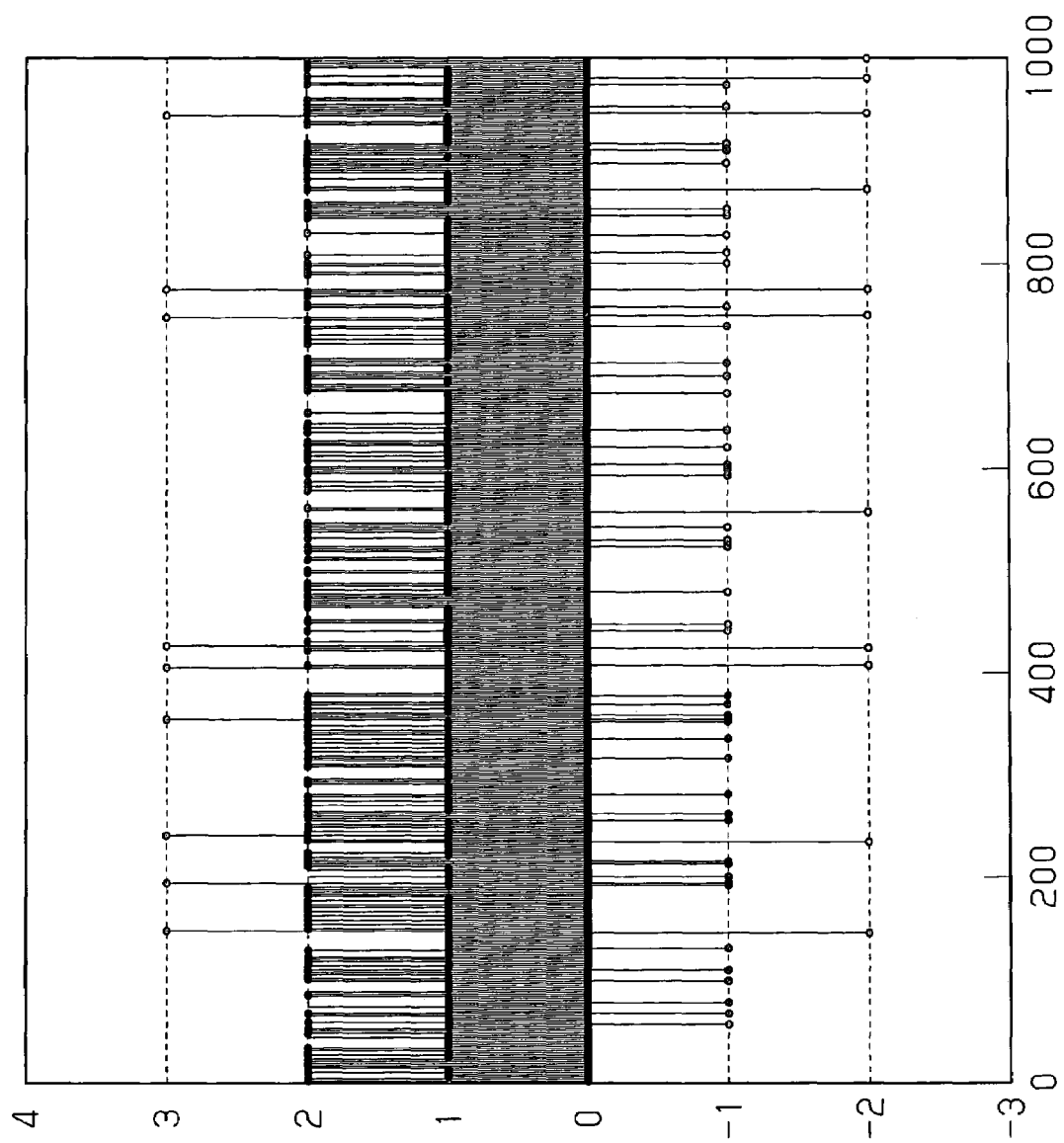
FIG. 9 is an explanatory diagram exemplifying the modulation width of a modulation output of the third-order sigma-delta modulator of the present invention.

FIG. 9 shows random numbers generated in the adder 11 when the frequency division ratio of the frequency divider 15 is set at 9. In this case, the random numbers become +3 or −2 further less frequently.

Figure 10:
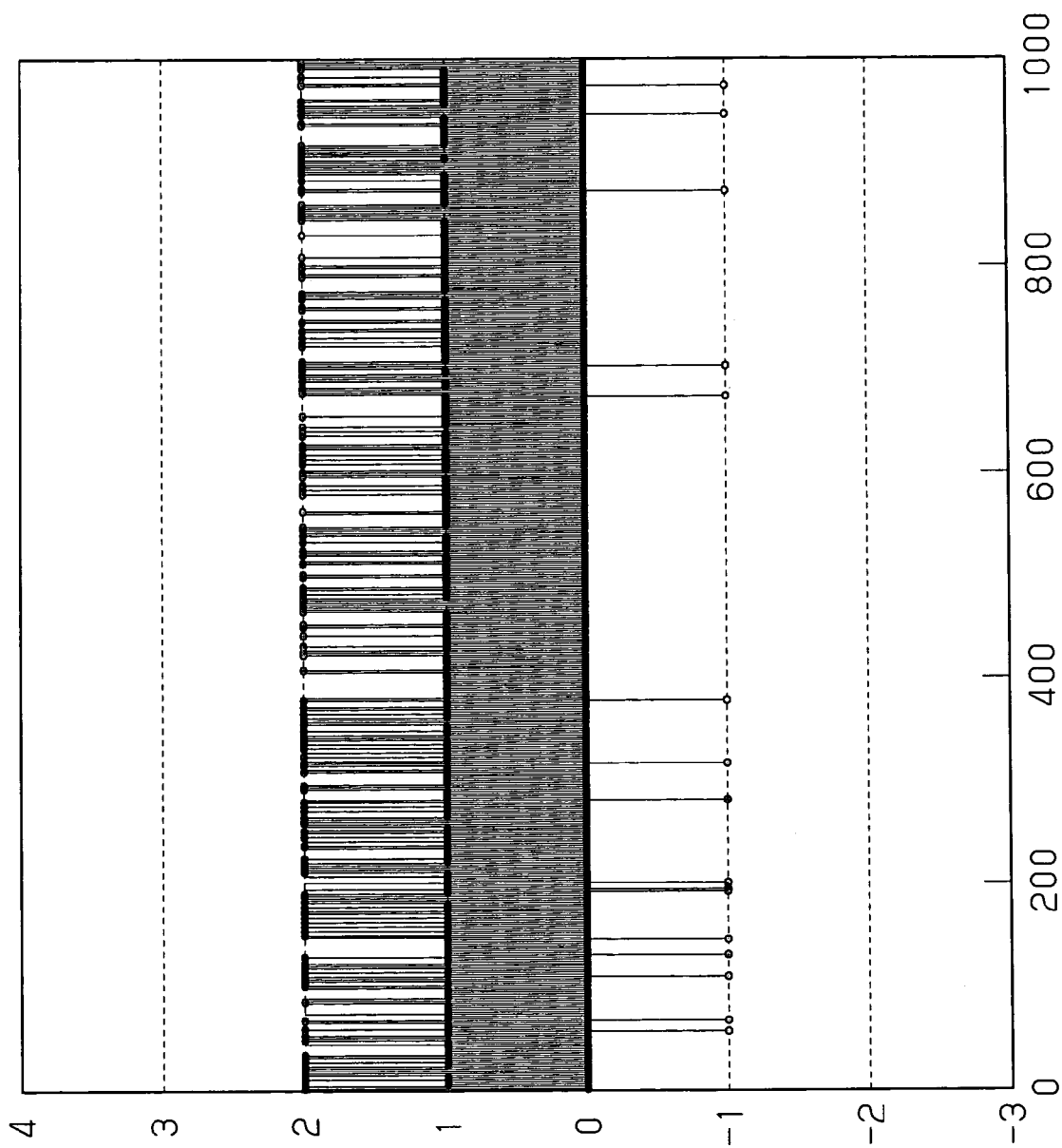
FIG. 10 is an explanatory diagram exemplifying the modulation width of a modulation output of a second-order sigma-delta modulator.

FIG. 10 shows a case in which the frequency division ratio of the frequency divider 15 is further increased to substantially ∞. In this case, the random numbers become as close as possible to the random numbers generated in a second-order sigma-delta modulator.

Figure 7:
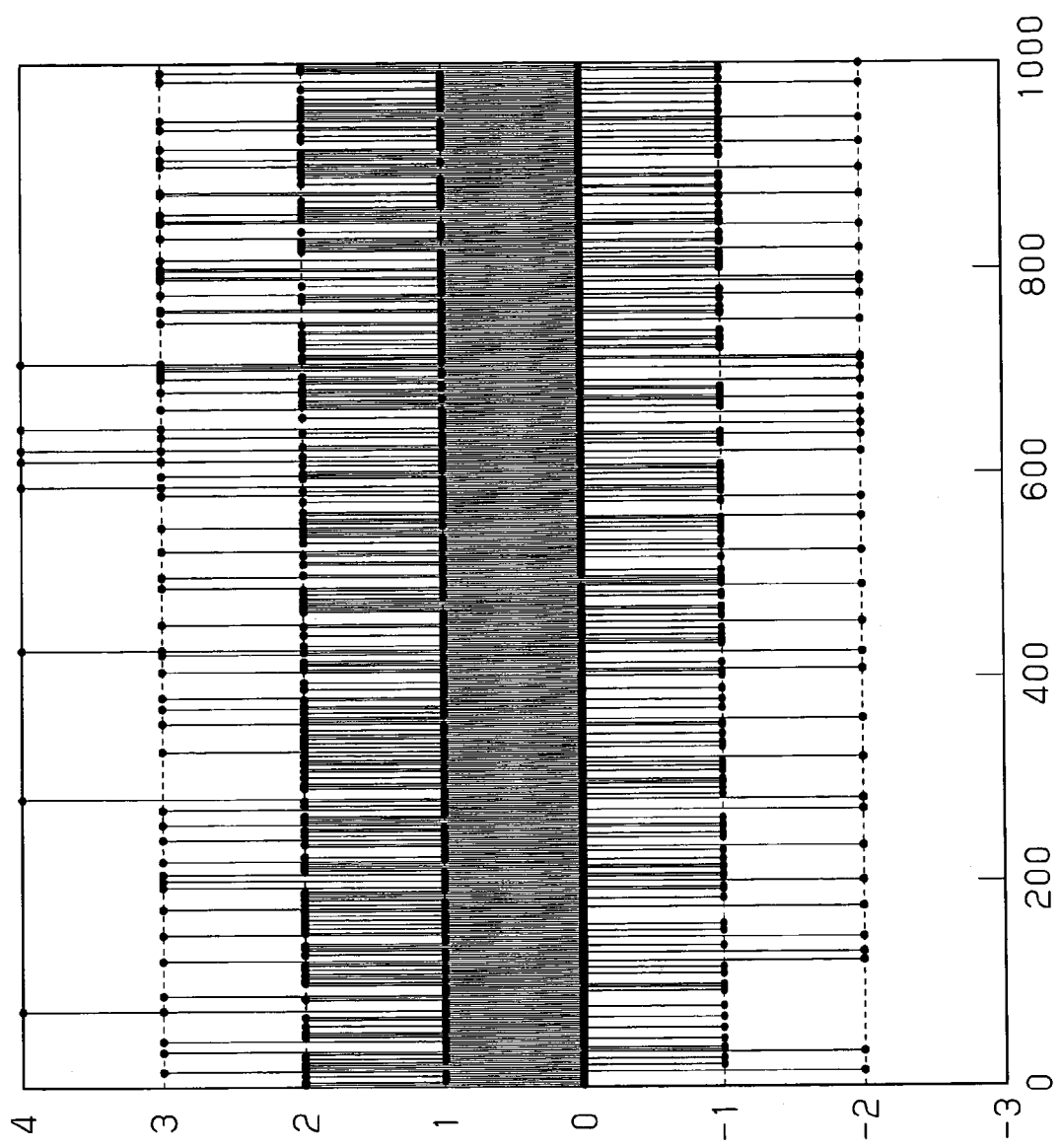
FIG. 7 is an explanatory diagram exemplifying the modulation width of a modulation output of a third-order sigma-delta modulator according to a prior art example.

Further, when the frequency division ratio of the frequency divider 15 is set at 1, the random numbers are those generated in the normal third-order sigma-delta modulator shown in FIG. 7.

Figure 11:
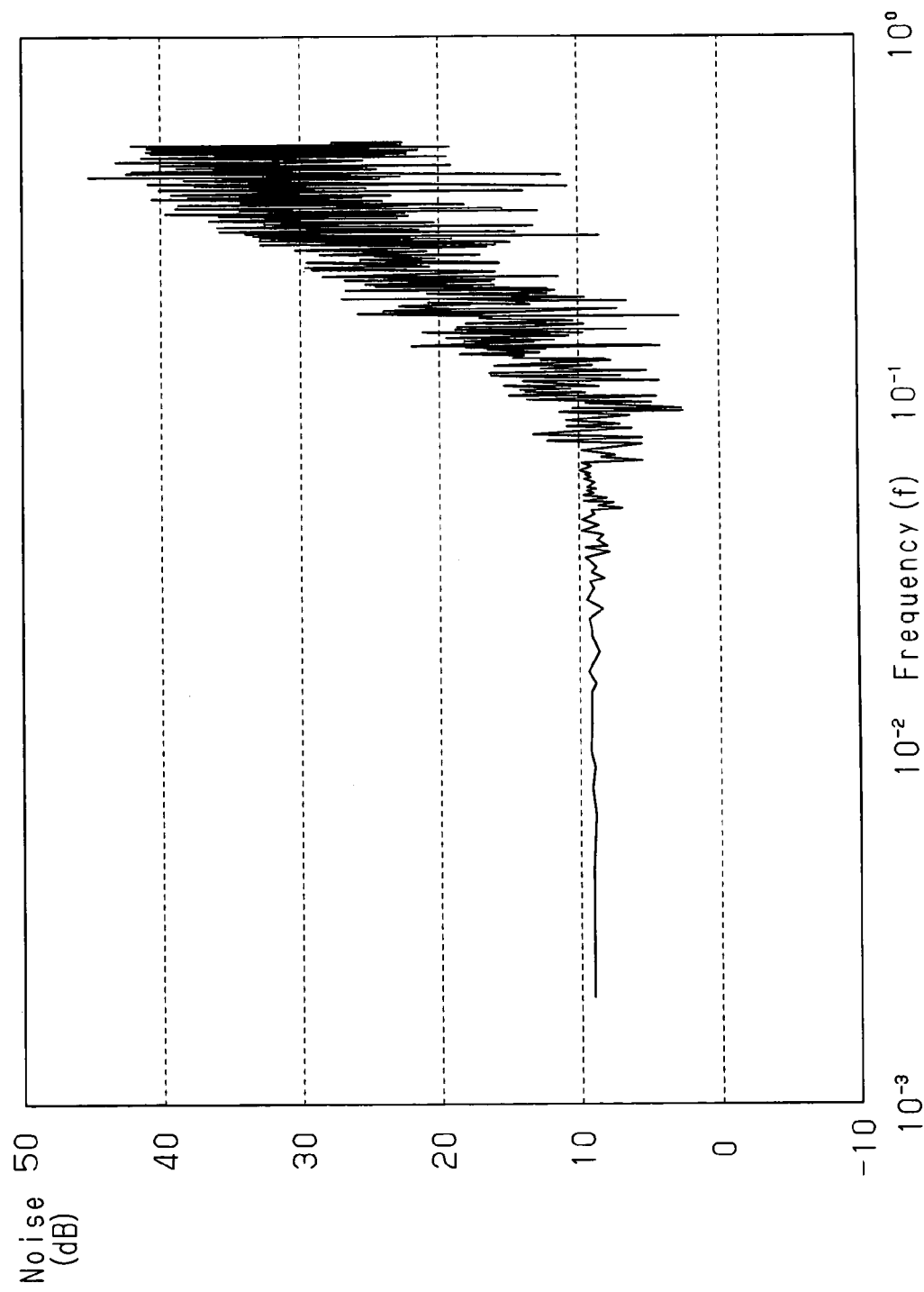
FIG. 11 is an explanatory diagram showing a simulation of an output signal of a PLL based frequency synthesizer having the third-order sigma-delta modulator in the prior art.
Figure 15:
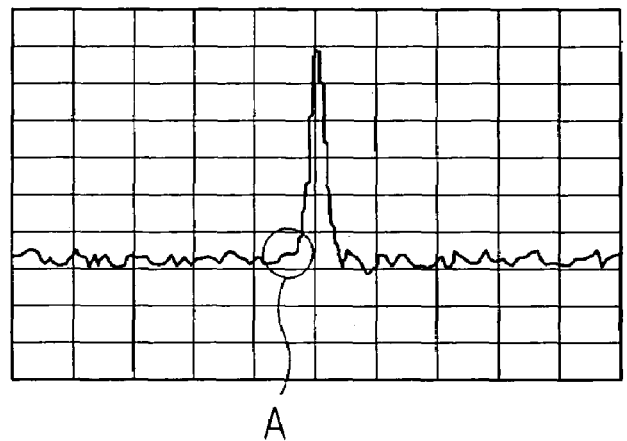
FIG. 15 is an explanatory diagram showing the frequency spectrum of an output signal of a PLL based frequency synthesizer having a third-order sigma-delta modulator.
Figure 16:
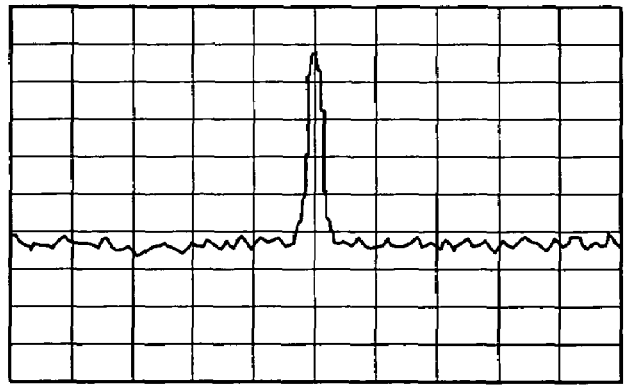
FIG. 16 is an explanatory diagram showing the frequency spectrum of an output signal of a PLL based frequency synthesizer having a fourth-order sigma-delta modulator.

FIG. 11 shows simulation of noise elements of an output signal of a fractional-N PLL frequency synthesizer using the third-order sigma-delta modulator of the prior art. FIG. 11 corresponds to portion A of the frequency spectrum shown in FIG. 15.

Figure 12:
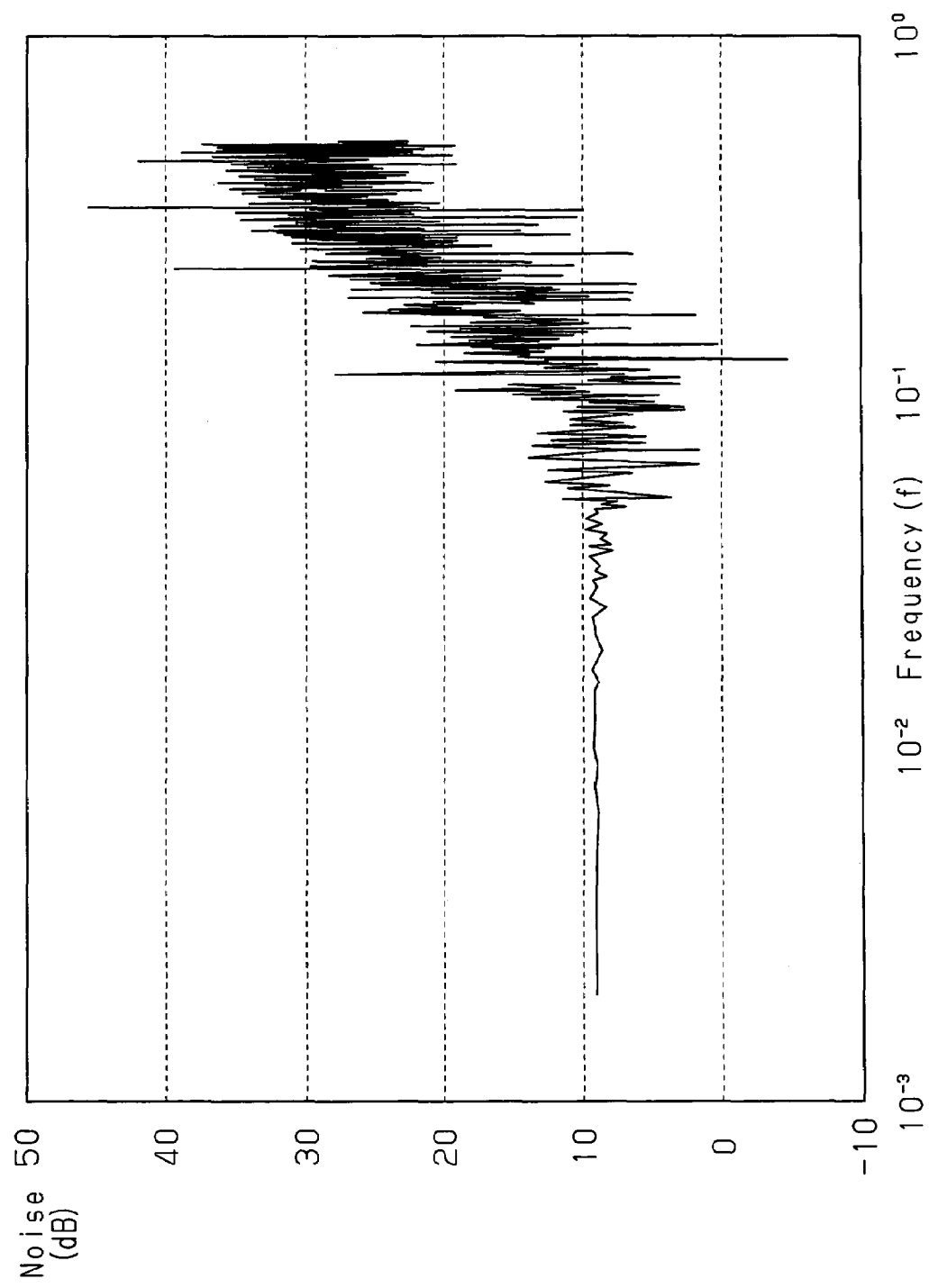
FIG. 12 is an explanatory diagram showing a simulation of an output signal of a PLL based frequency synthesizer having the third-order sigma-delta modulator of the present invention.

FIG. 12 shows a simulation of noise elements of an output signal of a fractional-N PLL frequency synthesizer using the third-order sigma-delta modulator of the preferred embodiment shown in FIG. 1.

As apparent from the comparison between FIGS. 11 and 12, the preferred embodiment attenuates the noise elements entirely by about 5 dB in comparison with the prior art.

The sigma-delta modulator and the sigma-delta fractional-N PLL frequency synthesizer of the preferred embodiment have the advantages described below.

(1) The comparator/frequency divider 4 performs the fractional frequency division operation based on the output signal of the sigma-delta modulator 50. This enables the reference signal fr to have a higher frequency. Thus, the channel switching speed, that is, the lockup speed of the output signal fvco of the PLL circuit is increased, and the C/N characteristic is improved.

(2) The fluctuation width of the random numbers, which are the computation values of the sigma-delta modulator 50, is reduced while the order number of the sigma-delta modulator 50 is increased. As a result, the modulation width of the comparator/frequency divider 4 is reduced, the noise level of the output signal fvco of the PLL circuit is reduced, and the C/N characteristic is improved.

(3) The fluctuation width of the random numbers that are the computation values of the sigma-delta modulator 50 is reduced, while the order number of the sigma-delta modulator 50 is increased. This prevents the lockup speed from being lowered by an increase in the order number of the sigma-delta modulator 50.

(4) The order number of the sigma-delta modulator 50 is increased, and the noise level of the output signal of the PLL circuit is stabilized.

(5) The fluctuation width of the random numbers that are the computation values of the sigma-delta modulator 50 is reduced simply by adding the control circuit 12 to the structure of the prior art.

(6) The fluctuation width of the random numbers that are the computation values of the sigma-delta modulator 50 is continuously changed by adjusting the frequency division ratio of the frequency divider 15 that forms the control circuit 12. In the preferred embodiment, the fluctuation width of the random numbers can be continuously changed in a range of values obtained between the second-order and the third-order.

(7) The frequency division ratio of the frequency divider 15 is adjustable by changing the data DATA that is input into the shift register 14. As a result, the noise level of the output signal fvco of the PLL circuit is easily adjustable by inputting the data DATA from an external device and adjusting the fluctuation width of the random numbers.

The application of the present invention should not be limited to the third-order sigma-delta modulator. The present invention may be applied to a fourth or higher order sigma-delta modulator. In this case, the control circuit is arranged between the integrator of the final stage and the integrator of the stage preceding the final stage.

The frequency divider included in the control circuit 12 may operate at a fixed frequency division ratio.

The sigma-delta fractional-N PLL frequency synthesizer of the present invention may be used either in a PLL circuit at a base station or in a PLL circuit at a mobile station.

The invention claimed is:

1. A sigma-delta modulator for generating a modulation signal for modulating a frequency division ratio for a comparator/frequency divider of a PLL circuit, the sigma-delta modulator comprising:

a plurality of series-connected integrators, each accumulating an input signal based on a clock signal and outputting an overflow signal when an accumulated value exceeds a predetermined value;

a plurality of differentiators selectively connected to the plurality of integrators, each of the differentiators transferring an overflow signal of a corresponding one of the integrators;

an adder for multiplying the overflow signals transferred from the plurality of differentiators by a predetermined coefficient and adding the products to generate the modulation signal; and a control circuit, connected between a first integrator of a final stage and a second integrator of a stage preceding the final stage, for providing an output signal of the second integrator to the first integrator in synchronization with a frequency-divided signal obtained by frequency-dividing the clock signal.

2. The sigma-delta modulator according to claim 1, wherein the control circuit includes:

a frequency-dividing circuit for dividing the frequency of the clock signal to generate the frequency-divided signal; and a gate circuit, connected between the second integrator and the first integrator, for outputting an accumulated value of the second integrator to the first integrator in synchronization with the frequency-divided signal generated by the frequency-dividing circuit.

3. The sigma-delta modulator according to claim 1, wherein the control circuit includes:

a setting unit for generating a frequency division ratio setting signal for setting the frequency division ratio to frequency-divide the clock signal;

a frequency-dividing circuit for frequency-dividing the clock signal based on the frequency division ratio setting signal to generate the frequency-divided signal; and a gate circuit, connected between the second integrator and the first integrator, for providing an accumulated value of the second integrator to the first integrator in synchronization with the frequency-divided signal of the frequency-dividing circuit.

4. The sigma-delta modulator according to claim 3, wherein the setting unit enables the frequency division ratio setting signal to be adjusted based on data input from an external device.

5. The sigma-delta modulator according to claim 3, wherein the setting unit includes a shift register for generating the frequency division ratio setting signal, which has a plurality of bits, based on data input from an external device.

6. The sigma-delta modulator according to claim 2, wherein the frequency-dividing circuit includes a binary counter formed by a plurality of series-connected flip-flop circuits.

7. The sigma-delta modulator according to claim 3, wherein the frequency-dividing circuit includes:

a binary counter including a plurality of series-connected flip-flop circuits, each generating an output signal in accordance with the frequency division ratio setting signal; and a logic circuit unit for synthesizing the output signals of the flip-flop circuits to generate the frequency-divided signal.

8. The sigma-delta modulator according to claim 7, wherein the frequency-dividing circuit enables the frequency division ratio to be selected from any one of 1 to $2^n-1$ by selecting the output signal of a flip-flop circuit in the nth stages that is output to the logic circuit unit in accordance with the frequency division ratio setting signal.

9. The sigma-delta modulator according to claim 2, wherein the gate circuit includes a plurality of AND circuits, each receiving the frequency-divided signal and a corresponding one of a plurality of bits in the output signal of the second integrator.

10. A PLL circuit comprising:

a sigma-delta modulator for generating a modulation signal for modulating a frequency division ratio for a comparator/frequency divider of a PLL circuit, the sigma-delta modulator including:

a plurality of series-connected integrators, each accumulating an input signal based on a clock signal and outputting an overflow signal when an accumulated value exceeds a predetermined value;

a plurality of differentiators selectively connected to the plurality of integrators, each of the differentiators transferring an overflow signal of a corresponding one of the integrators;

an adder for multiplying the overflow signals transferred from the plurality of differentiators by a predetermined coefficient and adding the products to generate the modulation signal; and a control circuit, connected between a first integrator of a final stage and a second integrator of a stage preceding the final stage, for providing an output signal of the second integrator to the first integrator in synchronization with a frequency-divided signal obtained by frequency-dividing the clock signal; and a comparator/frequency divider, connected to the sigma-delta modulator, for performing a fractional frequency division operation according to a modulation signal of the sigma-delta modulator.

11. A fractional-N PLL frequency synthesizer, comprising:

a sigma-delta modulator for generating a modulation signal for modulating a frequency division ratio for a comparator/frequency divider of a PLL circuit, the sigma-delta modulator including:

a plurality of series-connected integrators, each accumulating an input signal based on a clock signal and outputting an overflow signal when an accumulated value exceeds a predetermined value;

a plurality of differentiators selectively connected to the plurality of integrators, each of the differentiators transferring an overflow signal of a corresponding one of the integrators;

an adder for multiplying the overflow signals transferred from the plurality of differentiators by a predetermined coefficient and adding the products to generate the modulation signal; and a control circuit, connected between a first integrator of a final stage and a second integrator of a stage preceding the final stage, for providing an output signal of the second integrator to the first integrator in synchronization with a frequency-divided signal obtained by frequency-dividing the clock signal;

a comparator/frequency divider, connected to the sigma-delta modulator, for performing a fractional frequency division operation in accordance with a modulation signal of the sigma-delta modulator and generating a comparison signal;

a reference frequency divider for generating a reference signal; and a phase comparator, connected to the comparator/frequency divider and the reference frequency divider, for comparing the reference signal and the comparison signal and generating a phase comparison signal.

* * * * *